United States Patent [19]

Ip et al.

[11] Patent Number: 5,747,200
[45] Date of Patent: May 5, 1998

[54] MASK STRUCTURE HAVING OFFSET PATTERNS FOR ALIGNMENT

[75] Inventors: Hiu F. Ip; Ellick L. Ma, both of San Jose, Calif.

[73] Assignee: Micrel, Incorporated, San Jose, Calif.

[21] Appl. No.: 518,633

[22] Filed: Aug. 23, 1995

[51] Int. Cl.$^6$ ............................................ H01L 21/30
[52] U.S. Cl. ............................ 430/22; 430/5; 356/399; 356/400
[58] Field of Search ........................... 356/399–401; 430/22, 30, 5

[56] References Cited

U.S. PATENT DOCUMENTS

| | | | |
|---|---|---|---|
| 4,388,386 | 6/1983 | King et al. | 430/22 |
| 4,530,604 | 7/1985 | Okutsu et al. | 356/401 |
| 4,849,313 | 7/1989 | Chapman et al. | 430/22 |
| 5,362,585 | 11/1994 | Adams | 430/30 |
| 5,468,580 | 11/1995 | Tanaka | 430/22 |

FOREIGN PATENT DOCUMENTS

| | | | |
|---|---|---|---|
| 57-45236 | 3/1982 | Japan | 430/22 |
| 58-39015 | 3/1983 | Japan | 430/22 |
| 60-77421 | 5/1985 | Japan | 430/22 |

OTHER PUBLICATIONS

Thompson et al. "Introduction to Microlithography" ACS (1983) pp. 20–23.

Primary Examiner—Martin Angebranndt
Attorney, Agent, or Firm—Skjerven, Morrill, MacPherson, Franklin & Friel; Brian D. Ogonowsky

[57] ABSTRACT

A structure and method are disclosed which allow for a more efficient use of silicon in a wafer fabrication process. In accordance with the present invention, the layout of masks used in the fabrication of circuit dice is modified by re-configuring the operating protocol of the stepper such that the alignment keys and targets are formed in the two subfields lying in the upper-left and upper-right corners, respectively, of each field. Thus, the 200 μm-wide portion of each field previously used for alignment (i.e., alignment scribe line 34 of FIG. 2) may now contain patterns used in the formation of circuit dice, thereby increasing the amount of usable surface area on the associated underlying wafer. The operating protocol is further modified such that scribe lines separating rows and columns of subfields are less than 100 μm wide, thereby resulting in a further reduction in the unused or wasted portions of the silicon wafer, particularly in applications having a large number of small die formed on the wafer.

6 Claims, 3 Drawing Sheets

MASK STRUCTURE HAVING OFFSET PATTERNS FOR ALIGNMENT

FIELD OF THE INVENTION

The present invention relates to reticles used in the fabrication of integrated circuits (ICs) and, specifically, to reticles allowing for more efficient use of wafer surface area.

BACKGROUND OF THE INVENTION

Typically, in forming the various layers on a semiconductor wafer to create an integrated circuit, the wafer is covered with a film of photoresist and, using a masking pattern, selectively exposed to radiation such as ultraviolet radiation. After exposure of the photoresist, the wafer is typically dipped in a developing solution for dissolving away the soluble portions of the photoresist to selectively expose the underlying layer. This underlying layer is then subjected to one or more process steps such as doping, implantation, etching, oxidation, deposition, and so on, to complete formation of the layer. Subsequent layers may then be formed by repeating the above process using other suitable masking patterns. In some instances, multiple layers may be fabricated using a single masking step.

The photoresist is exposed by interposing a mask between the radiation source and the wafer. Such a mask typically includes a quartz reticle having formed thereon one or more fields each containing an array of optically opaque patterns which correspond to patterns to be formed in the photoresist. The reticle is then stepped and repeated across the wafer using a stepper.

FIG. 1 shows a conventional mask 10 used in conjunction with the Ultratech UltraStep 1000 stepper (UTS) to form an IC (not shown). Mask 10 includes a quartz reticle 12 having formed thereon four fields 14, 16, 18, 20 each containing an associated array of subfields 22, 24, 26, 28, respectively. Typically, each of subfields 22, 24, 26, 28 contains a masking pattern which corresponds to an individual die to be fabricated on the wafer (not shown). During fabrication of the dice, the patterns formed within the subfields 22, 24, 26, 28 of respective fields 14, 16, 18, 20 are used in successive masking steps in the fabrication of the dice. For instance, patterns formed by the array of subfields 22 of field 14 may be used in defining an oxide layer, patterns formed by the array of subfields 24 of field 16 may be used in defining a poly-silicon layer, and so on. Fiducials 30a and 30b are provided on reticle 12 to align fields 14, 16, 18, 20 to the wafer, thereby aligning patterns formed by fields 14, 16, 18, 20 with one another.

FIG. 2 shows in greater detail field 14. Note that, with the exception of specific masking patterns formed therein, fields 14, 16, 18, 20 are identical structures. Thus, the discussion that follows with reference to field 14 is equally applicable to fields 16, 18, 20.

A baseline 32 provided on reticle 12 extends in a horizontal direction between fiducials 30a. Field 14 is positioned on reticle 12 such that the top of field 14 extends precisely 200 μm above baseline 32. This 200 μm-high portion of field 14 contains an alignment scribe line 34. The array of subfields 22a–22x is positioned immediately below baseline 32 and is thus adjacent to alignment scribe line 34. The rows and columns of subfields 22a–22x are separated by scribe lines 36 which provide spacing between rows and columns of subfields 22a–22x necessary for the cutting of the wafer into individual die.

Mask 10 is fabricated as follows. Reticle 12 is covered with a layer of chrome (not shown) which is opaque to UV radiation. The layout of mask 10 (i.e., the number and dimensions of fields and subfields, the specific masking patterns to be formed with the subfields, and so on) is programmed into the UTS. The chrome layer is then selectively removed using, for instance, a scanning electron beam to form fields 14, 16, 18, 20 in accordance with the above-mentioned programmed layout.

The UTS includes a microscope which, by way of various alignment keys and targets provided within field 14, is used to align mask 10 with the wafer. One limitation of the UTS is that the UTS is able to move reticle 12 only in a horizontal direction. As such, the alignment keys and targets of each of fields 14, 16, 18, 20 provided on reticle 12 must be horizontally aligned so as to pass under the alignment microscope when reticle 12 is moved in the horizontal direction between exposure steps. Accordingly, the UTS's operating protocol, the Horizontal Alignment Movement (HAM) scheme, requires that all alignment keys and targets be contained in an alignment scribe line 34, e.g., in that portion of field 14 which lies above baseline 32. Since alignment scribe line 34, which typically has a width 36 of 200 μm, contains keys and targets for aligning reticle 12 to the wafer, the area occupied by alignment scribe line 34 may not be used for forming dice.

In order to allow the dice which are formed on the wafer to be cut and separated using uniform saw cuts, that is, such that all saw cuts are of an equal width, scribe lines 36 interposed between adjacent ones of subfields 22a–22x must be of the same width as the width 36 of alignment scribe line 34, i.e., 200 μm.

Thus, using the UTS in accordance with this conventional HAM scheme results in the wafer having a grid of 200 μm wide strips of unused silicon, thereby resulting in a wasting of valuable silicon surface area. Such a wasting of silicon area becomes more pronounced as the number of dice desired to be formed on each wafer increases, since additional rows and/or columns of dice require additional 200 μm-wide scribe lines 36.

Reducing the width of scribe line 36 in an effort to minimize wasting silicon surface area would, in order to allow for uniform saw cuts during separation of individual die from the wafer, require a corresponding reduction in the width of alignment scribe line 34. Reducing the width of alignment scribe line 34 to less than 200 μm, however, would not allow sufficient area for the formation of alignment keys and targets. Thus, there is a need for a masking structure and method for creating and using the same which minimizes unused portions of a wafer without sacrificing the surface area of a field necessary to contain alignment keys and targets.

SUMMARY

A structure and method are disclosed which allow for a more efficient use of silicon in a wafer fabrication process. In accordance with the present invention, the layout of masks used in the fabrication of integrated circuits is modified by re-configuring the HAM scheme of a UTS such that the alignment keys and targets are formed in the two subfields lying in first and second corners, respectively, of each field.

Thus, the 200 μm-wide portion of each field previously used for alignment (i.e., alignment scribe line 34 of FIG. 2) may now contain patterns used in the formation of integrated circuits, thereby increasing the amount of usable surface area on the associated underlying wafer.

The HAM scheme is further modified such that the scribe lines which separate rows and columns of subfields are between 50 and 100 µm wide, as opposed to the 200 µm width required by the conventional HAM scheme. Reducing the width of the scribe lines further results in a more efficient use of the silicon wafer, especially in those applications where a large number of small die are formed on a wafer.

DETAILED DESCRIPTION

Figure 2:
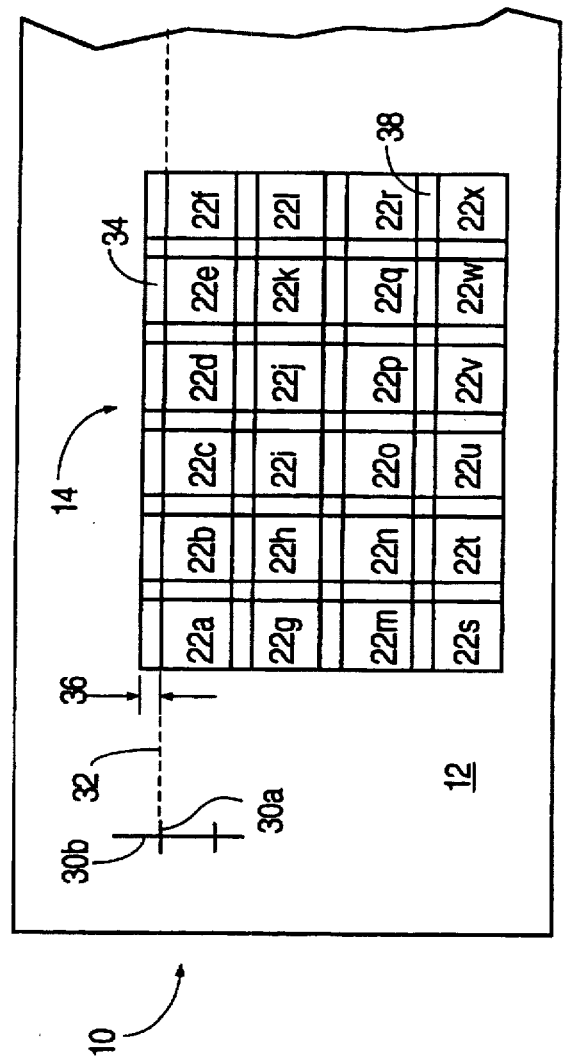
FIG. 2 is a top view of a portion of the mask shown in FIG. 1.
Figure 3:
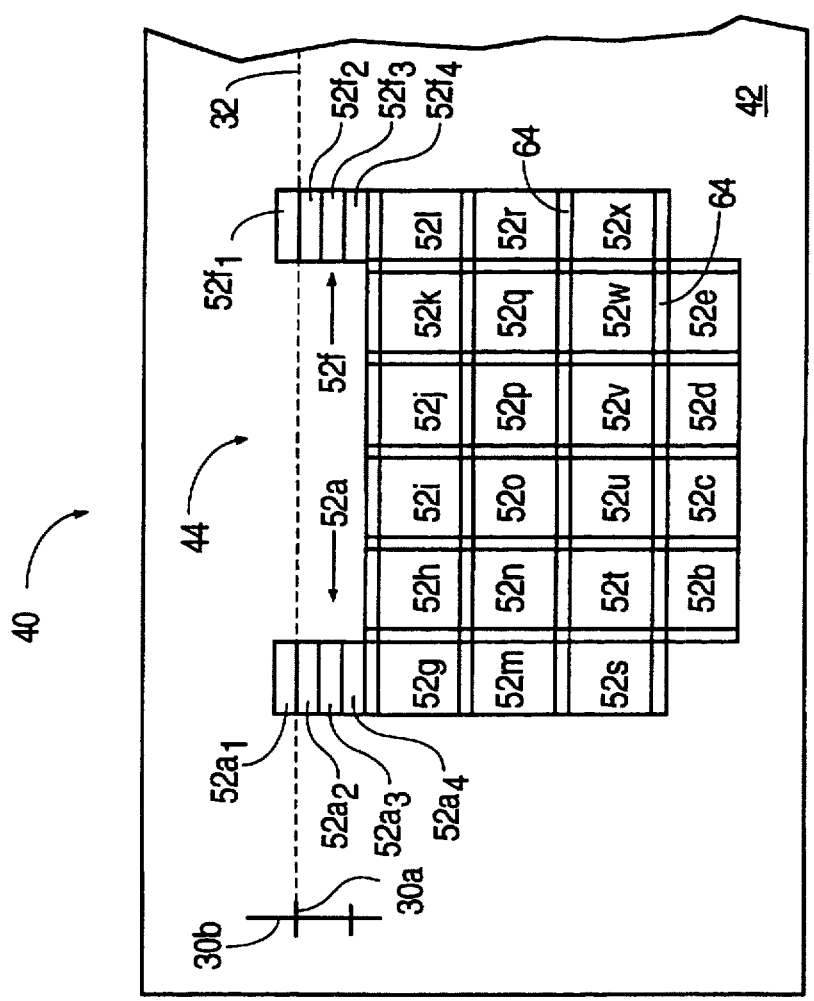
FIG. 3 is a top view of a portion of a mask in accordance with the present invention showing one field.

FIG. 3 is a top view of a portion of a mask structure 40 including a reticle 42 having formed thereon a field 44 in accordance with the preferred embodiment of the invention. Preferably, reticle 42 is a transparent quartz substrate. Those components of mask structure 40 which are similar to components in the conventional mask 10 (FIGS. 1 and 2) are appropriately labelled with the same numerals.

The fabrication and structure of field 44 of mask 40 will be discussed below with reference to FIGS. 2, 3 and 4. As mentioned earlier, the UTS is pre-programmed, according to the HAM scheme, to operate using a mask layout similar to the conventional parallelogram mask 10 of FIG. 2. Before programming the specifics of such a mask, i.e., the number and size of fields, the specific mask pattern(s) to be formed within the subfields, and so on, the programmed layout of the mask is altered so as to result in a mask layout similar to that of mask structure 40 of FIGS. 3 and 4 as follows.

Starting with conventional field 14 of mask 10 (FIG. 2), the HAM scheme is modified so as to blank the subfields lying in the upper-right and upper-left corners of the field 14, i.e., subfields 22a and 22f, respectively. In other words, no masking patterns will be formed in subfields 22a and 22f. The remaining subfields 22b–22e of the top row of field 14 are then "moved" to below the bottom row and positioned such that subfields 22b–22e lie immediately below subfields 22t–22w, respectively. The resultant structure is that of field 44, as shown in FIG. 3, where subfields 22a–22x of FIG. 2 correspond to subfields 52a–52x of FIG. 3.

Figure 1:
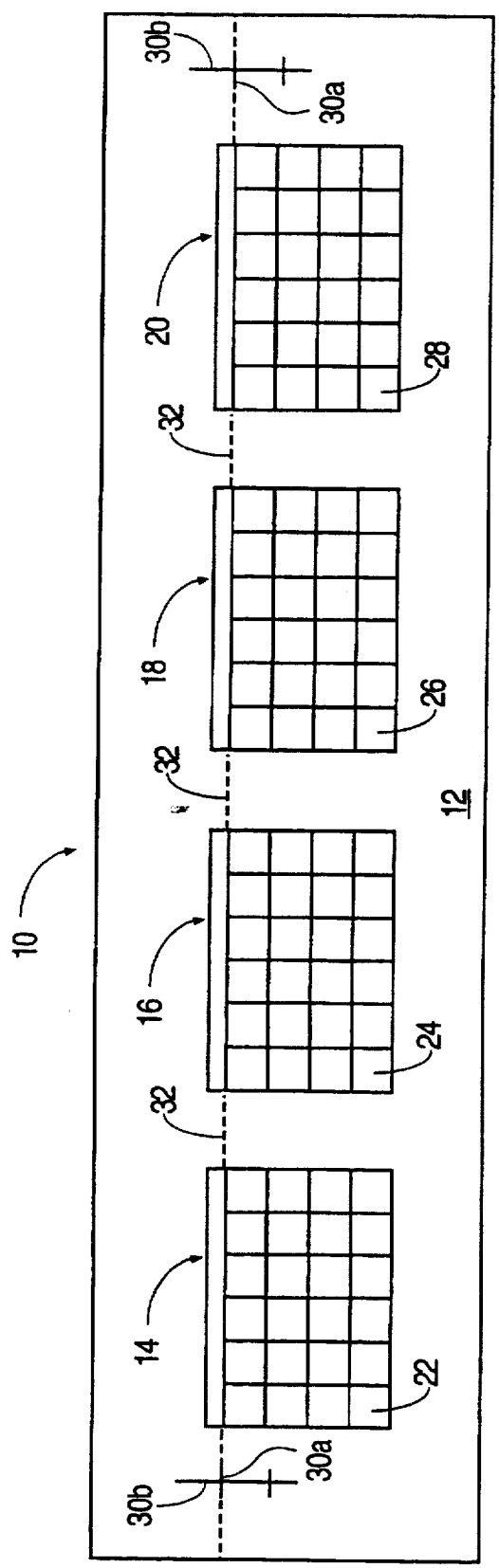
FIG. 1 is a top view of a conventional mask having four fields, each of which containing a different masking pattern for forming different layers of an IC.

The HAM scheme is further modified such that the alignment keys and targets for each of the fields formed on mask 40 will be formed within horizontal alignment regions $52a_1$–$52a_4$ and $52f_1$–$52f_4$ of subfields 52a and 52f, respectively. Preferably, each region $52a_1$–$52a_4$ and $52f_1$–$52f_4$ has a vertical dimension of 200 µm to allow sufficient area for the formation of alignment keys and targets. Thus, since all alignment keys and targets are contained entirely within subfields 52a and 52f, there is no need for an alignment scribe line such as alignment scribe line 34 of prior art mask 10 (FIGS. 1 and 2).

Figure 4:
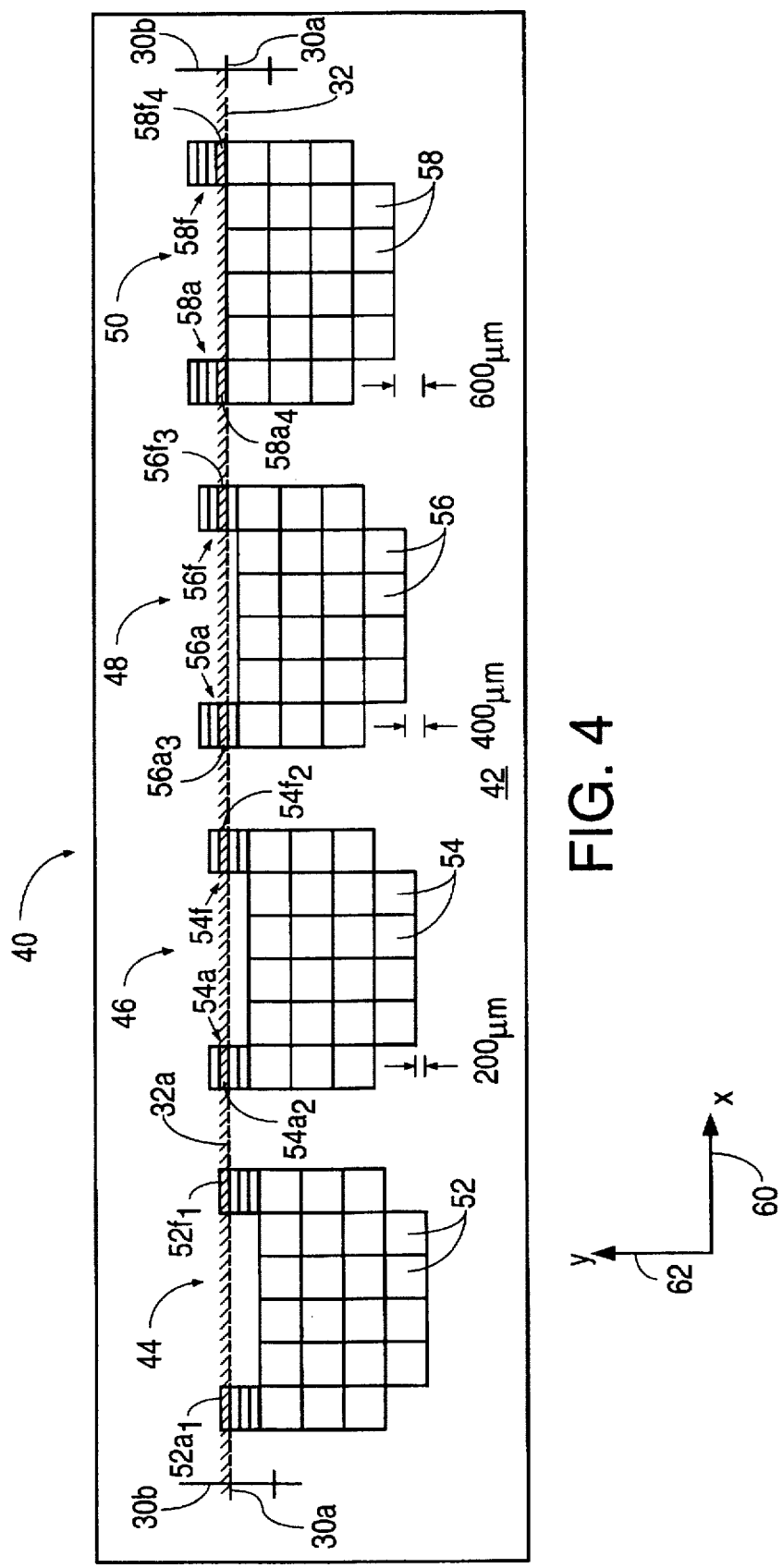
FIG. 4 is a top view of the mask of FIG. 3 shown to include four fields.

FIG. 4 shows mask structure 40 including reticle 42 having formed thereon four fields 44, 46, 48, 50. The layout of each of fields 46, 48, 50 is created as described above with respect to field 44. With the exception of the specific masking patterns formed within each of subfields 52, 54, 56, 58 of fields 44, 46, 48, 50, respectively, fields 44, 46, 48, 50 comprise identical structures. The alignment keys and targets used in aligning field 44 to a die are contained in the first alignment regions $52a_1$ and $52f_1$, the alignment keys and targets used in aligning field 46 to the die are contained in the second alignment regions $52a_2$ and $52f_2$, and so on. The alignment keys and targets used to align the fields with the die will, in the preferred embodiment, span the entire length (as defined by arrow 60 in FIG. 4) of regions 52a and 52f. Further, alignment subfields 52a, 54a, 56a, and 58a of respective fields 44–50 are identical, and alignment subfields 52f, 54f, 56f, and 58f of respective fields 44, 46, 48, 50 are identical, i.e., regions $52a_1$–$52a_4$ are identical to respective ones of regions $54a_1$–$54a_4$, $56a_1$–$56a_4$, and $58a_1$–$58a_4$, while regions $52f_1$–$52f_4$ are identical to respective ones of regions $54f_1$–$54f_4$, and so on. Fiducials 30a, 30b and baseline 32 are provided on reticle 42 for alignment of fields 44, 46, 48, 50 to one another on reticle 42.

The patterns formed within subfields 52b–52e and 52g–52x of field 44 (FIG. 3) correspond to a first masking step in the formation of an IC. Field 44 is positioned on reticle 42 such that baseline 32 extends through field 44 at points precisely 200 µm below the top of subfields 52a and 52f. That is, all but alignment regions 52a, and $52f_1$ of field 44 lies below baseline 32.

The patterns formed within subfields 54b–54e and 54g–54x of field 46 correspond to a second masking step in the formation of the aforementioned circuit dice.

Recalling that the alignment keys and targets used to align field 46 with the dice are contained in the second alignment regions $54a_2$ and $54f_2$ of field 46, and that the UTS alignment scheme requires that all alignment keys and targets for each field be contained within a 200 µm-high horizontal "alignment" strip, the positioning of field 46 on reticle 42 must be offset with respect to field 44 so that alignment regions $54a_2$ and $54f_2$ will pass underneath the UTS's alignment microscope, as illustrated in FIG. 4, where that portion of reticle 42 which passes under the microscope is denoted by a cross-hatched strip 32a. Accordingly, field 46 is offset precisely 200 µm with respect to field 44, as shown in FIG. 4, such that the tops of alignment regions $54a_2$ and $54f_2$ lie immediately below baseline 32 and are thus in horizontal alignment with alignment regions 52a, and $52f_1$ of field 44 on reticle 42.

In a similar manner, the alignment keys and targets for aligning fields 48 and 50 are contained in the third alignment regions $56a_3$ and $56f_3$ of field 48 and fourth alignment regions $58a_4$ and $58f_4$ of field 50, respectively. Thus, fields 48 and 50 are displaced 400 µm and 600 µm, respectively, with respect to field 44 such that alignment regions $56a_3$ and $56f_3$ of field 48 and alignment regions $58a_4$ and $58f_4$ of field 50 are positioned within alignment strip 32a.

Those alignment regions of the subfields 52, 54, 56, 58 which contain alignment keys and targets used in the alignment of previous fields are preferably covered with chrome so that keys and targets used in aligning previous fields are not again formed on the wafer. For instance, alignment regions $54a_1$ and $54f_1$ of field 46, in which the alignment keys and targets used to align field 44 with the die are contained, are covered with chrome, as are alignment regions $56a_1$–$56a_2$ and $56f_1$–$56f_2$ of field 48, and so on.

In using reticle 44 to form circuit dice, field 42 is first exposed to UV radiation such that all of the alignment keys and targets contained in alignment subfields 52a and 52f, as well as the die patterns contained in subfields 52b–52e and 52g–52x, are formed in a photoresist layer overlying the wafer. The wafer is then removed so that appropriate processing steps such as, for instance, doping, implanting, or etching, may be performed to complete the first layer of each circuit die so defined by field 44.

The wafer is then re-inserted into the UTS and positioned such that the center of the wafer is displaced precisely 200 μm in a second direction, as defined by arrow 62 of FIG. 4, as compared to its position during exposure of field 44. For example, assuming the wafer is initially inserted into the UTS for exposure of field 44 such that the center of the wafer is at the origin of an arbitrary coordinate system x,y, where the x and y axes are denoted by arrows 60 and 62, respectively, the center of the wafer should be at a position 0, 200 μm prior to exposure of field 46. This re-positioning of the wafer ensures that the alignment keys and targets of alignment region 54$a_2$ and 54$f_2$ are in alignment with those alignment keys and targets previously formed on the wafer by field 44. The wafer is then removed from the UTS and subjected to appropriate processing steps. This process is again repeated for each of the remaining fields 48 and 50 of reticle 42, wherein the wafer is moved 200 μm in the positive y direction prior to each succeeding masking step.

The alignment regions 52$a$1–$a$4, 54$a$1–$a$4, 56$a$1–$a$4, and 58$a$1–$a$4 of respective fields 44, 46, 48, 50 are not limited to a 200 μm-width. However, each of fields 46, 48, 50 must be displaced, with respect to the preceding field, a distance equal to the width of the alignment regions. Accordingly, upon each reinsertion into the UTS, the wafer must be shifted in the second direction 62 a distance equal to the width of the alignment regions.

It is also to be understood that the specific embodiments of FIGS. 3 and 4 are merely illustrative and that reticle 42 may contain a greater or fewer number of fields. Similarly, although each of the fields depicted in FIGS. 3 and 4 are shown to include 24 subfields, in actual embodiments each such field may contain a greater or fewer number of subfields. Further, more than two subfields may contain alignment keys and targets. Where, for instance, a field contains 15 columns and 10 rows of subfields, the alignment keys and targets may be contained in six of the subfields of the top row, i.e., the three closest to the left edge and the three closest to the right edge of the field. In such a case, the remaining nine subfields of the top row would, as described above, be re-positioned below the last row.

Providing the alignment keys and targets within the subfields as discussed above results in a more efficient use of wafer surface area in those cases where the surface area of a portion of the wafer previously rendered unusable by virtue of 200 μm wide alignment scribe line 34 (see FIGS. 1 and 2), which may now be used to accommodate die, exceeds the surface areas of those subfields which, in accordance with the present invention, contain alignment keys and targets. Thus, as the size of the dice fabricated in accordance with the above described structure and method decreases, the savings in silicon surface area increase.

Further, since reticle 42 neither contains nor requires a field-wide alignment scribe line such as alignment scribe line 34 of conventional reticle 12 (FIGS. 1 and 2), scribe lines 64 which separate adjacent subfields 52, 54, 56, 58 of reticle 42 (FIGS. 3 and 4) are not limited to a 200 μm width, as are scribe lines 38 of conventional reticle 12. Rather, scribe lines 64 are preferably only 80 μm wide. Reducing the width of scribe lines 64 further increases the usable portion of the wafer, thereby resulting in additional savings in silicon real estate.

Applicants have found that fabricating ICs using the UTS in accordance with the above-disclosed structure and method may result in increasing the usable portion of a wafer by as much as 18% over using the UTS in conjunction with the conventional HAM scheme.

It is to be further noted that the present invention is not limited to use with the UTS. Rather, the principles discussed above in accordance with the present invention may be used in conjunction with any conventional stepper.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A mask for selectively exposing a layer on a semiconductor wafer to radiation, said mask comprising:

a first array of subfields arranged in a plurality of rows and columns, subfields in said first array being separated from adjacent subfields in said first array by scribe line regions, wherein certain columns of subfields in said first array of subfields are each shifted by one subfield in a direction parallel to said columns such that an end subfield in each of said certain columns is not opposing any other subfields in other columns of said first array;

first alignment keys formed in at least one of a plurality of rows forming alignment regions formed in each of said end subfield in each of said certain columns of said first array of subfields; and first patterns formed in remaining subfields in said first array of subfields for selectively exposing a first section of said wafer to said radiation, wherein said first alignment keys are used to align said first array of subfields to said first section of said wafer, said mask further comprising:

a second array of subfields arranged in a plurality of rows and columns, arranged identically to the first array wherein subfields in said second array being separated from adjacent subfields in said second array by scribe line regions, wherein certain columns of subfields in said second array of subfields are each shifted by one subfield in a direction parallel to said columns of said second array such that an end subfield in each of said certain columns of said second array is not opposing any other subfields in other columns of said second array;

second alignment keys formed in at least one of a plurality of rows forming alignment regions formed in each of said end subfield in each of said certain columns of said second array of subfields; and second patterns formed in remaining subfields in said second array of subfields for selectively exposing said first section of said wafer to said radiation, wherein said second alignment keys are used to align said second array of subfields to said first section of said wafer.

2. The mask of claim 1 wherein said second patterns are different from said first patterns.

3. The mask of claim 1 wherein said second alignment keys are formed in another of said alignment regions in said first array.

4. The mask of claim 1 wherein said first array of subfields and said second array of subfields are formed on a same mask substrate offset from one another in a direction parallel to said columns of said first array and said second array.

5. The mask of claim 1 wherein said alignment regions of said subfields in said first array of subfields are aligned, in said direction perpendicular to said columns, with said alignment regions of said subfields in said second array of subfields.

6. A method for selectively exposing a photoresist layer on a wafer to radiation using a mask having alignment keys and having a first mask pattern and a second mask pattern, said method comprising the steps of:

positioning said wafer in an original position;

aligning said first mask pattern of said mask to said wafer using first alignment keys, wherein said first mask pattern includes:

a first array of subfields arranged in a plurality of rows and columns, subfields in said first array being separated from adjacent subfields in said first array by scribe line regions, wherein certain columns of subfields in said first array of subfields are each shifted by one subfield in a direction parallel to said columns such that an end subfield in each of said certain columns is not opposing any other subfields in other columns of said first array;

first alignment keys formed in at least one of a plurality of rows forming alignment regions formed in each of said end subfield in each of said certain columns of said first array of subfields; and first patterns formed in remaining subfields in said first array of subfields for selectively exposing a first section of said wafer to said radiation, wherein said first alignment keys are used to align said first array of subfields to said first section of said wafer;

exposing said wafer to radiation so that said first mask pattern causes a corresponding first image to impinge on a section of said wafer;

aligning said second mask pattern of said mask to said wafer using second alignment keys, wherein said second mask pattern includes:

a second array of subfields arranged in a plurality of rows and columns, arranged identically to the first array wherein subfields in said second array being separated from adjacent subfields in said second array by scribe line regions, wherein certain columns of subfields in said second array of subfields are each shifted by one subfield in a direction parallel to said columns of said second array such that an end subfield in each of said certain columns of said second array is not opposing any other subfields in other columns of said second array;

second alignment keys formed in at least one of a plurality of rows forming alignment regions formed in each of said end subfield in each of said certain columns of said second array of subfields;

second patterns formed in remaining subfields in said second array of subfields for selectively exposing said first section of said wafer to said radiation, wherein said second alignment keys are used to align said second array of subfields to said first section of said wafer, said second alignment keys being aligned with said first alignment keys on said first section of said wafer; and exposing said wafer to radiation so that said second mask pattern causes a corresponding second image to impinge on said section of said wafer which had previously exposed.

* * * * *